United States Patent [19]

MacCormack et al.

[11] 4,383,439
[45] May 17, 1983

[54] FAN LOAD SIMULATED AUTOMATIC MOTOR TEST BOARD

[75] Inventors: Alexander A. MacCormack; Vernon E. Kieffer, both of St. Louis, Mo.

[73] Assignee: Emerson Electric Co., St. Louis, Mo.

[21] Appl. No.: 226,752

[22] Filed: Jan. 21, 1981

[51] Int. Cl.³ ................... G01M 15/00; G01L 3/16
[52] U.S. Cl. ................................. 73/116; 73/862.15
[58] Field of Search ............ 73/116, 118, 119 R, 73/862.15; 318/490

[56] References Cited

U.S. PATENT DOCUMENTS

| 1,369,018 | 2/1921 | Fell | 73/862.15 |
| 2,579,804 | 12/1951 | Dotson | 73/116 |
| 3,111,841 | 11/1963 | Gray | 73/116 |
| 3,898,875 | 8/1975 | Knoop et al. | 73/116 |

FOREIGN PATENT DOCUMENTS

| 475517 | 2/1966 | Japan | 73/116 |
| 784676 | 10/1957 | United Kingdom | 73/862.15 |
| 619818 | 6/1978 | U.S.S.R. | 73/862.15 |
| 779842 | 12/1978 | U.S.S.R. | 73/116 |

Primary Examiner—Howard A. Birmiel
Attorney, Agent, or Firm—Polster, Polster and Lucchesi

[57] ABSTRACT

A motor test board is provided which permits automatic testing of an electrical motor under load, in addition to permitting other conventional motor tests. In the preferred embodiment, the motor load is a simulated fan load imposed by a windbat which is calibrated to an intended actual load for the motor. A strobe disc is attached the windbat and is designed to permit determination of RPM and direction of rotation for the motor under test. The windbat and associated structure is automatically attached to the motor undergoing test, and the attaching mechanism is disassociated from the motor and load during test so that the test results closely parallel applicational use of the motor.

21 Claims, 7 Drawing Figures

4,383,439

FAN LOAD SIMULATED AUTOMATIC MOTOR TEST BOARD

BACKGROUND OF THE INVENTION

This invention relates to testing apparatus for dynamoelectric machines, and in particular, to a test system for automatically imposing fan loads on an electrical motor undergoing test. While the invention is described with regard to fan loads for electric motors, those skilled in the art will recognize the wider applicability of the inventive concepts disclosed hereinafter.

It has long been the practice in the manufacturing of dynamoelectric machines, and in particular, of electric motors, to run a series of operational and quality control checks to ensure that products produced by a motor plant, for example, are operating properly prior to shipment to a particular customer. Among the more common production tests imposed on motors during manufacture are a surge test in which a high voltage surge is applied to the motor windings to check for wire damage that can result in an open circuit of the motor winding; a high pot or high potential test to check the motor windings for electrical shorts between windings and to ground; and various start tests to ensure that the motor will start some predetermined load even under low voltage conditions.

With the growing concern over energy efficient products, motor manufacturers more recently have been required to ensure that their motors meet other performance standards prior to shipment. For example, many customers require that the motor be tested under operating conditions or load points to ensure that performance standards at such load point falls within predetermined, acceptable limits.

When motors are intended, in applicational use, to operate a fan load, for example, testing under full load has heretofore been troublesome for the motor manufacturer. In the first place, attachment of the fan load for the motor, when that load is a conventional fan blade, is relatively time-consuming and expensive because it is highly labor intensive. In addition, many of the fan blades used as motor loads are made from thin aluminum sheets or other similar material which can be bent easily. The distortion of the pitch of a fan blade changes the operating conditions of the blade and motor combination so that it is difficult, under production conditions, to ensure that the fan blades themselves are calibrated properly.

The direction of rotation of a motor also requires verification in many instances. Again, with production volumes, it has heretofore been difficult to consistently check motor rotation, the historic test being a visual observation of the direction of rotation.

We have found that with relatively small motors, that is, subfractional motors, mechanical couplings between the motor and the device used to load the motor during test often adversely affects the motor test. With small motors, the effect of this coupling is unacceptable.

One of the objects of this invention is to provide a motor test system which facilitates testing of a motor under a desired load.

Another object of this invention is to provide a motor test system which automatically connects a fan load to a motor, and disassociates itself during test so that an accurate test at the desired load point is obtained.

Another object of this invention is to provide a simulated fan load which may be calibrated to a desired fan load which maintains its calibration over extended time periods.

Another object of this invention is to provide a simulated fan load which facilitates the automatic determination both of motor speed and direction of motor rotation.

Another object of this invention is to provide a test device for determining speed and direction, particularly of relatively small motors, which imposes absolutely no load on the motor during test.

Another object of this invention is to provide a low cost device for conducting a predetermined number of motor tests.

Other objects of this invention will be apparent to those skilled in the art in light of the following description and accompanying drawings.

SUMMARY OF THE INVENTION

In accordance with this invention, generally stated, a fan load simulated automatic motor test board system is provided which permits automatic attachment and disconnection of a fan load to a motor, the attachment/disconnection apparatus itself being mechanically disassociated from the motor and fan combination during test. In the preferred embodiment of the invention, the fan load is a simulated device calibrated against weight and air movement capabilities of the intended application. A strobe disc also is associated with the simulated fan load which is constructed to permit determination of motor speed and direction and motor rotation automatically.

DESCRIPTION OF THE PREFERRED EMBODIMENT

Figure 1:
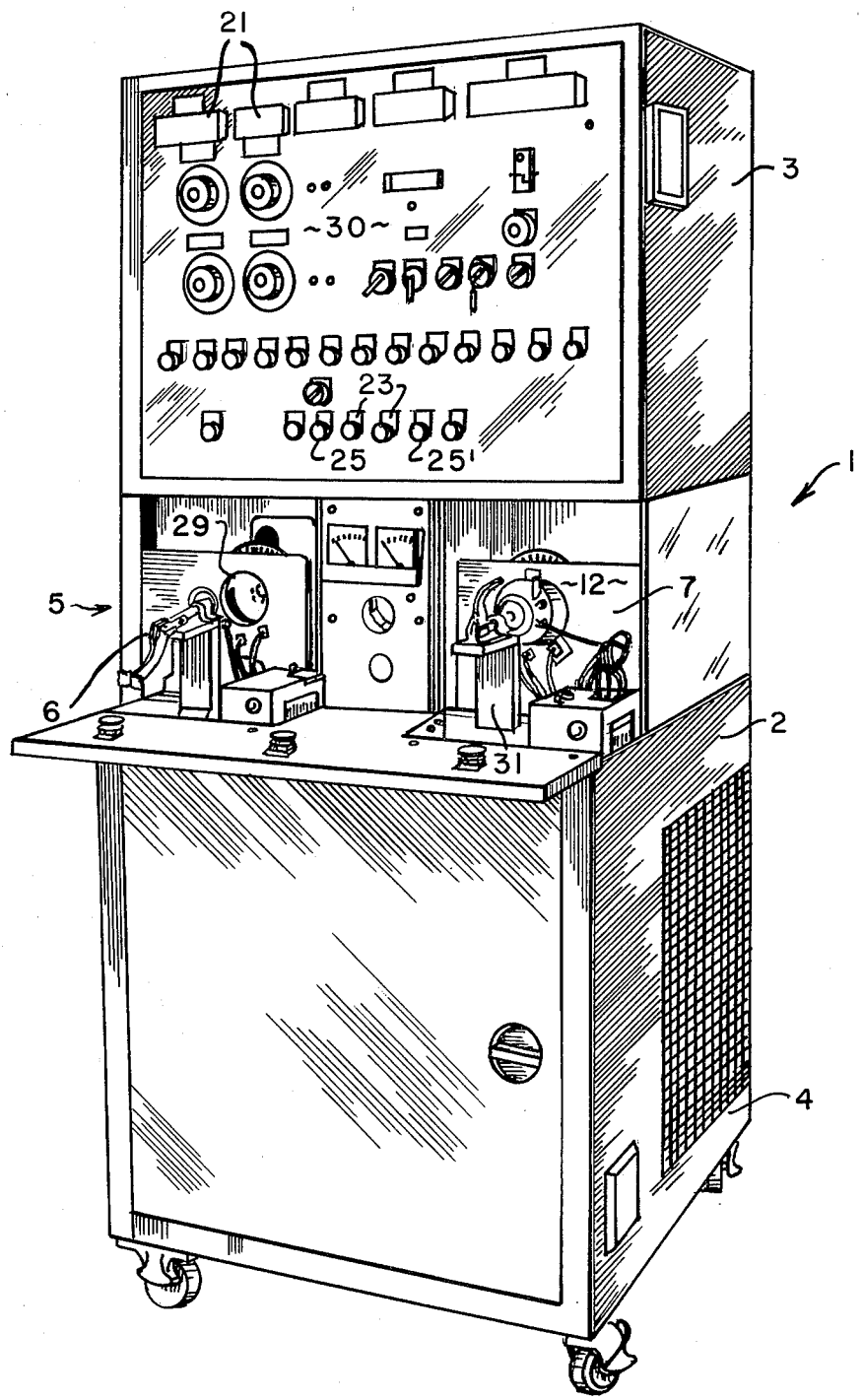
FIG. 1 is a view in perspective of one illustrative embodiment of fan load simulated automatic motor test system of this invention.

Referring now to FIG. 1, reference numeral 1 indicates one illustrative embodiment of fan load simulated automatic motor test system of this invention. The motor test system 1 includes an enclosure 2 having an upper part 3 and a lower part 4. A motor test area 5 is centrally located between the upper and lower parts 3 and 4, respectively.

The upper and lower parts 3 and 4 are enclosed areas housing various electrical and mechanical circuits and apparatus of the system 1. In general, the upper part 3 is used to report test results to the system 1 operator, and it has a display area 30 having various displays 21 mounted to it. The displays 21 which may comprise various counters, voltage and current meters, variacs, and suitable switches for initiating desired tests. The system 1 can be adapted to perform any one of a series of motor tests including surge tests, high potential tests, low voltage start, full load tests, speed calibration, and rotational direction tests, and is capable of providing read-outs in the form of watts, amps and voltage level at the motor test points. The results of the data so obtained is compared to permissible maximum and minimum levels for the particular motor under test. Failure of a particular test is indicated by simple "pass" or "fail" indicator lights 23 located at the display area 30. Because the system 1 is a two position device, we also provide a test position indicator light 25, 25' so that the operator can easily determine the status of the motor under test in either test position of the system. These kinds of motor tests have long been known in the motor field, and the particular tests themselves and the method generally employed in conducting such tests form no part of the invention described hereinafter.

Figure 2:
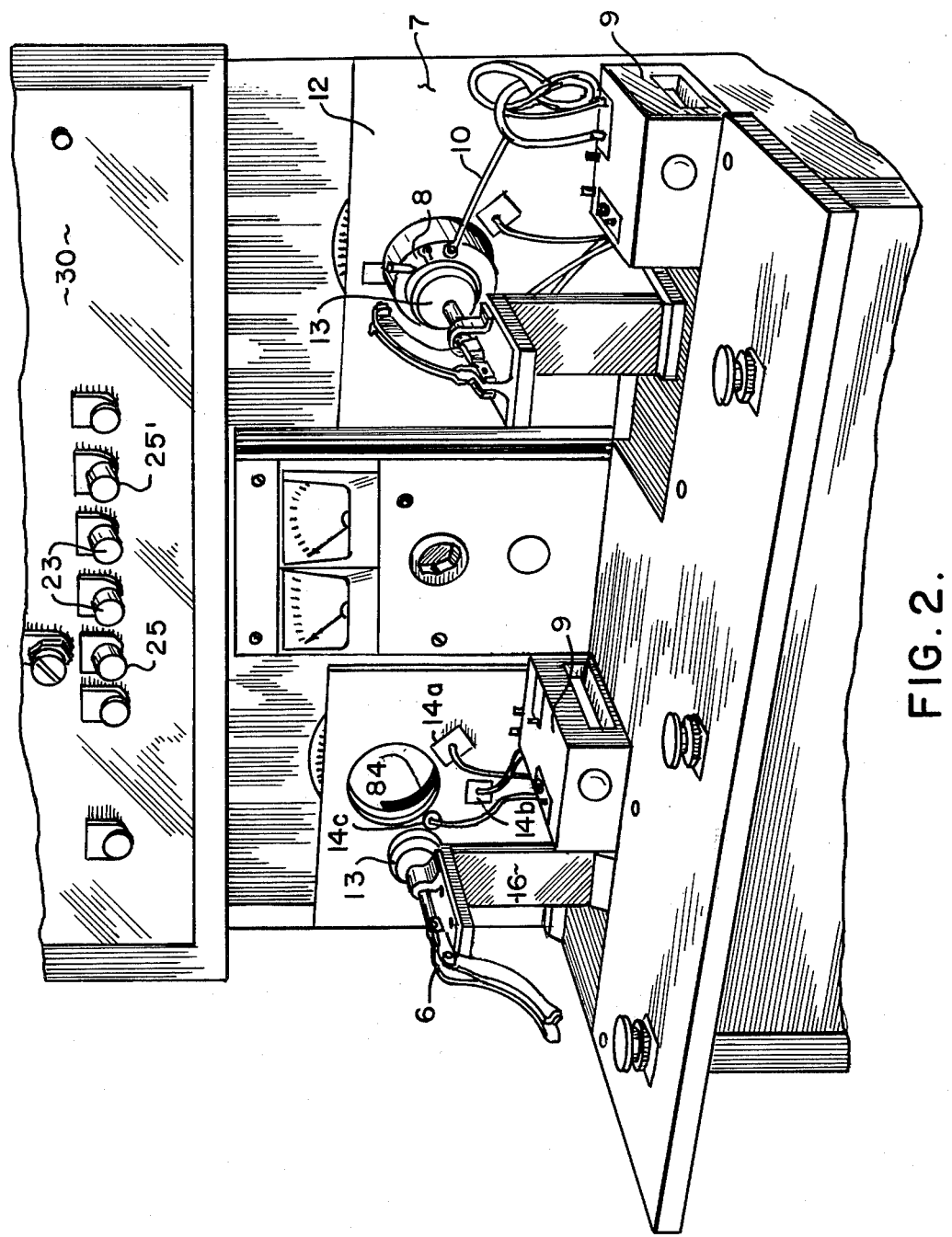
FIG. 2 is an enlarged view, partly broken away, of a pair of motor test stations employed with the device of FIG. 1.

The motor test area 5 includes a pair of motor test stations 6 and 7, respectively, which are substantially identical to one another. An enlarged front view of the test stations 6 and 7 is shown in FIG. 2. As there illustrated, the station 7 has a motor 8 mounted in it, while the station 6 is shown in its motor-free condition. In general, the system 1 of this invention is designed to be operated by a single workman who alternately places motors in respective ones of the stations 6 and 7. Each of the stations 6 and 7 also include a power supply interface 9 which has suitable quick-connect clamps 10' for attaching motor leads 10 to the interface 9. A variety of clamps 10' or other forms of quick connect terminals may be employed in embodiments of our invention.

Figure 3:
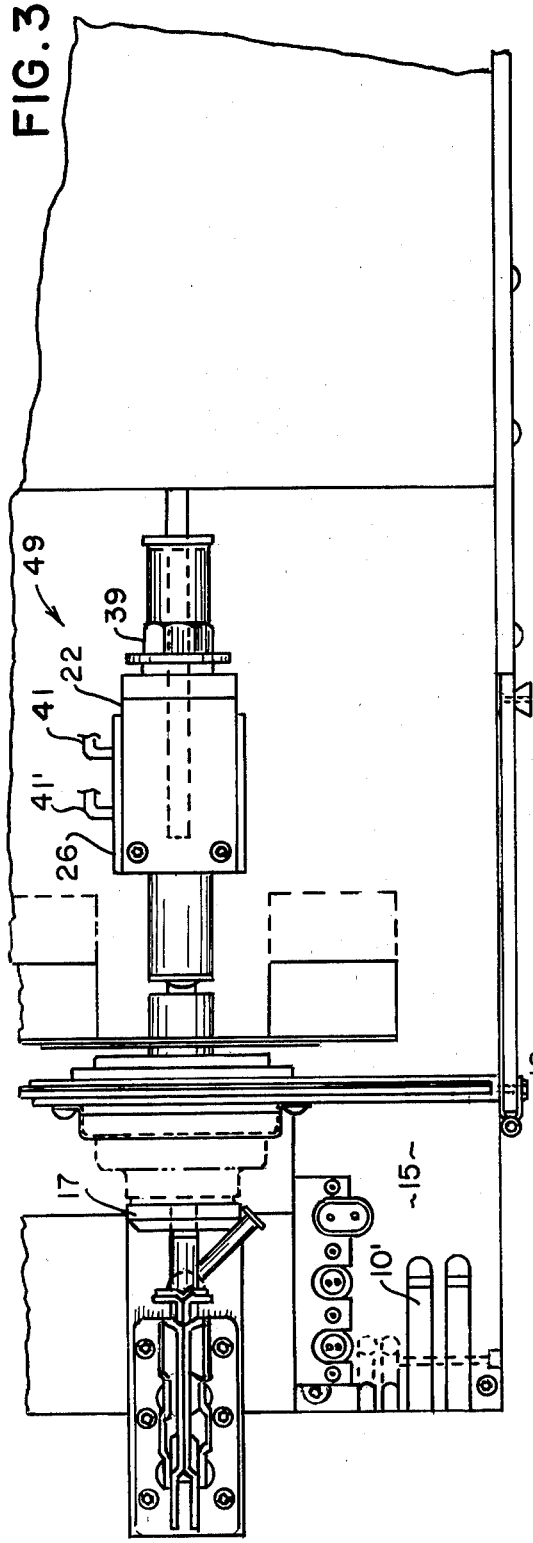
FIG. 3 is a top plan view of one of the motor test stations shown in FIG. 2.
Figure 4:
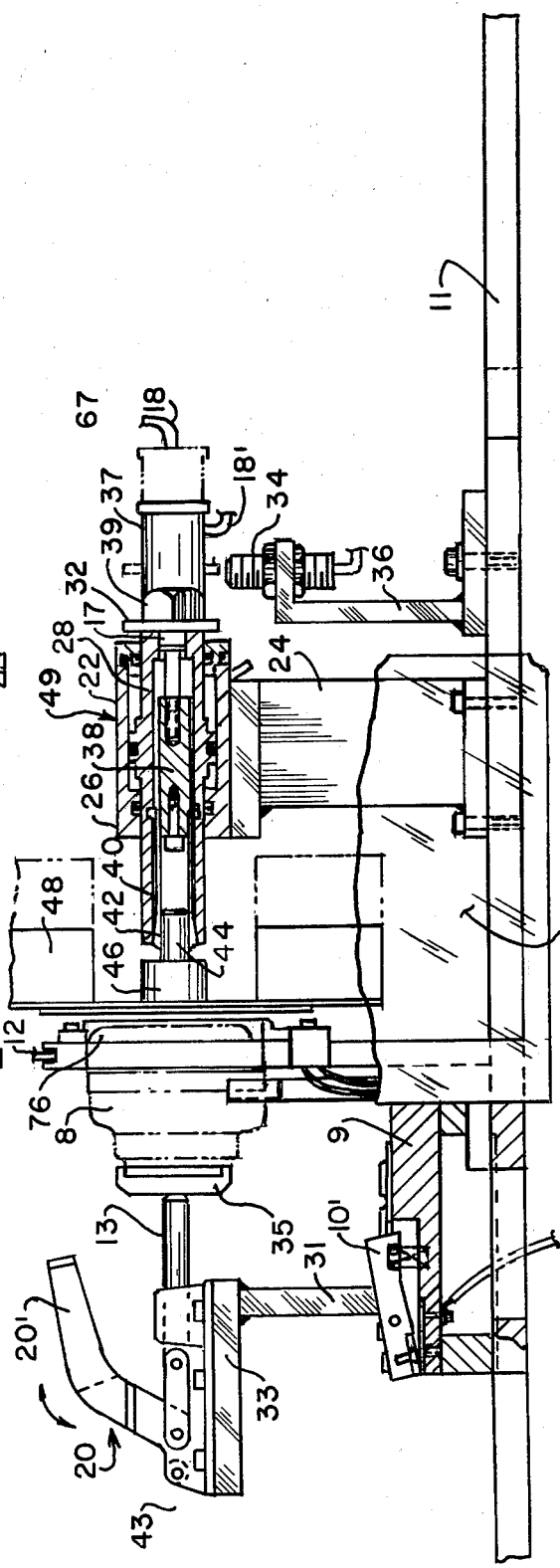
FIG. 4 is a view in side elevation, partly in section and partly broken away, of the motor test station shown in FIG. 3.

Referring now to FIGS. 3 and 4, the stations 6 and 7 generally are supported on a suitable surface 11 which in turn is supported by the lower portion 4 of the enclosure 2. As indicated, the stations 6 and 7 are similar to one another, and for the sake of brevity, only the station 7 is described in detail. The station 7 is divided into an operator side 15 and a test side 19 by a mounting plate 12. In the embodiment shown, the test side 19 of the station 7 is enclosed by a wall 27 of transparent material. The wall 27 preferably is constructed from a suitable plastic which permits observation of the test side 19 but prevents external forces from affecting the fan load imposed on the motor. The wall 27, of course, also performs a safety function.

The motor 8 is supported in its test position by the mounting plate 12. The plate 12 has a generally circular opening 29 formed in it, the opening 29 being sized to receive an exterior portion of the motor 8 in a friction fit. When positioned, a shaft of the motor 8 extends from the plate 12 toward the test side 19.

The plate 12 also houses a plurality of sensors 14a, 14b and 14c, which preferably are conventional photoelectric units. The operation and function of the sensors 14a, b and c are described in greater detail hereinafter. In general, the sensors 14a and 14c are utilized to provide rotational information to the operator of the system 1, while the sensor 14b is used to obtain speed information during motor test.

A motor position support 13 is supported at a spaced distance from the surface 11 by an inverted, L-shaped bracket 16. The bracket 16 includes an arm 31 which is attached to the surface 11 by any convenient method. Welding or conventional threaded fasteners work well, for example. A second arm 33 is attached to the arm 31 and is positioned parallel to the surface 11. The arm 31 has a conventional lever 20 mounted to it. The motor position support 13 is movable along an axis 43 by operation of the lever 20. The lever 20 is moved between the supported position shown in FIG. 4 and the disconnected position shown in FIG. 2 by simple operation of a handle 20' forward and aft as indicated by the arrow in FIG. 4. Preferably, the motor position support 13 has an end 35 sized to receive the end silhouette of the motor 8. Rightward movement of the handle 20' forces and holds the motor 8 in position along the plate 12.

The test side 19 of the test station 7 has an actuating means 22 mounted to the supporting surface 11 by a suitable bracket 24. In the embodiment illustrated, bracket 24 has a conventional "I" shape. Other shapes may be employed if desired.

The actuating means 22 includes an enclosure 26 having a cylinder 28 of a fluid drive mechanism 49 reciprocally mounted in it. The cylinder 28 also has a collet actuator 37 mounted for movement with the cylinder 28 along a connection 39. The cylinder 28 is operated by and connected to a suitable source of power, either air or hydraulic, for example, along line connections 41 and 41'. Movement of cylinder 28 causes both the cylinder 28 and the collet actuator 37 to move between a first position shown in phantom lines in FIG. 4 and a second position shown in full lines in FIG. 4.

The collet actuator 37 includes a switch trip 32 which is utilized to actuate a position sensing switch 34 attached to the surface 11 by a bracket 36. The position sensing switch 34 is used to initiate the various motor tests based on the location of the switch trip 32 as it moves with cylinder 28.

The collet actuator 37 also is a fluid operated device having a cylinder 17 operating between first and second positions depending on a supply of fluid provided to the actuator 31 along connectors 18 and 18'. The cylinder 17 of collect actuator 37 has a draw bar 38 attached to it. A collet 40 in turn is attached to the draw bar 38. The collet 40 is flared along an end 42, the end being sized to receive a shaft extension 44 of a chuck 46 attached to a windbat assembly 48. As will be appreciated by those skilled in the art, the cylinder 17 of the collet actuator 37 is shown in its retracted position in FIG. 4. When retracted, the design of the flared end 42 causes the collet 40 to grip the shaft extension 44 of the chuck 46 tightly. Movement of the cylinder 17 of the collet actuator 37 leftwardly, referenced to FIG. 4, automatically releases the pressure exerted by the end 42 of the shaft extension 44.

Figure 5:
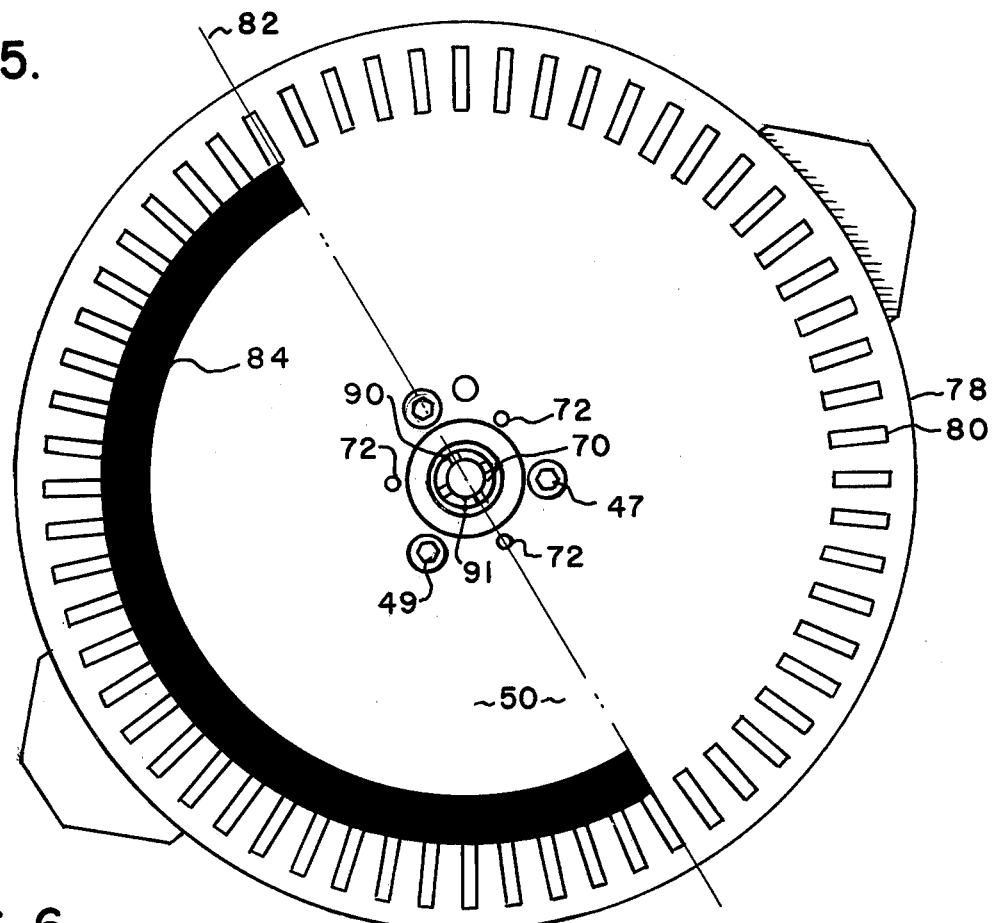
FIG. 5 is a front plan view of a strobe disc and simulated fan load utilized in conjunction with the test system of this invention.
Figure 6:
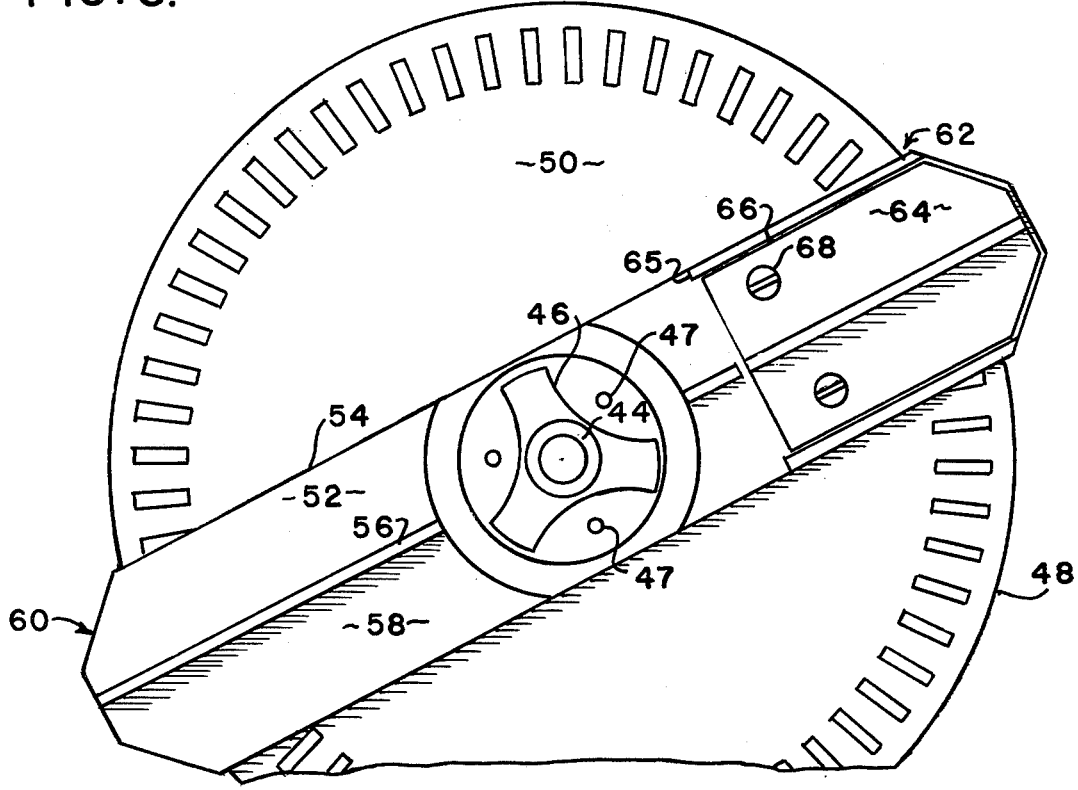
FIG. 6 is a rear plan view, partly broken away, of the strobe disc and simulated fan load shown in FIG. 5.

Windbat assembly 48 is best observed in FIGS. 5 and 6. As there illustrated, the windbat assembly 48 includes the centrally located chuck 46, which in turn has the shaft extension 44 integrally formed with it. The chuck 46 may assume a variety of design configurations, and any of those design configurations are compatible with the invention described herein. A plurality of threaded fasteners 47 mount the chuck 46 to a strobe disc 50 and to a load means 52 of the windbat assembly 48.

The load means 52, in the embodiment illustrated, includes an elongated body section 54 having a blade 56 extending outwardly from a base 58 of body section 54. An end 60 of the load means 52 is shown in a preferred, non-adjustable design. That is to say, the load means 52 may have its body section 54 formed symmetrically so that both ends of the load means corresponds to that shown for the end 60. Thereafter, the entire windbat assembly 48 is constructed and calibrated against the desired fan load for which a particular motor is being tested.

In the alternative, the base 58 may have a end 62 having an adjustable assembly 64 mounted for movement along the base 58. For example, runners 66 may be integrally formed along the base 58 so as to define a channel 65 sized to receive opposite edges of the adjustable assembly 64. The adjustable assembly 64 may be maintained in position at any desired location by conventional set screws 68. With the adjustable design of the windbat assembly 48 shown on the end 62 of the load means 52, the windbat assembly 48 may be adjusted so that it corresponds to a variety of known fan loads. Of course, it also may be calibrated for each of those loads. Thereafter, either the non-adjustable or adjustable design of the windbat assembly are used in the same way.

We prefer to use the non-adjustable design of the end 60 for production testing because that kind of design eliminates the possibility that the adjustment may be altered after calibration is accomplished.

The chuck 46 includes a motor shaft receiving end 70, best observed in FIG. 5. End 70 has a plurality of grooves 90 formed in it, extending through a closed bottom shaft receptacle 91. The head of the fasteners 47 extend through the strobe disc 50 to mount the strobe disc to the other elements of the windbat assembly 48. The chuck 46 has a plurality of spring biased fingers 72 mounted to it, which also extend through suitable openings in the strobe disc 50. The fingers 72 function both as an alignment device during placement of the windbat assembly 48 on the shaft of the motor 8 during test, and as a second engagement means with a rotating part of the motor. Conventionally, motors with which the test system 1 of this invention finds application have a end shield 76 through which a portion of a rotor assembly (not shown) can be reached. The fingers 72 are adapted to engage the rotor assembly so that the windbat assembly 48, in adition to being attached to the shaft of the motor 8, also is operatively connected to a rotating portion of the motor by the fingers 72.

Strobe disc 50 is a circular device having a peripheral edge 78. A plurality of slots 80 are formed from and through the material thickness of the strobe disc 50 along the edge 78. In the embodiment illustrated, the disc 50 has sixty of the slots 80 formed in it. While the number of the slots 80 may vary in other embodiments of this invention, the sixty slot number was chosen because it gives an adequate representation of speed in the operation of the test board of this invention.

The strobe disc 50 also is divided along an axis 82 by a semicircular black band 84 arranged so that half the disc is a first color while the other half of the disc is a second color. The alternating colors present to a first location as the windbat assembly 48 is driven by the motor 8 is used in the direction of rotation test described above.

Operation of the device of this invention is relatively simple to understand. The motor 8 is inserted in one of the motor test stations 6 and 7 and clamped in position by operation of the lever 20. Thereafter, the cylinder 28 is actuated from the source of fluid power, not shown, to move the cylinder 28 and collet actuator 37 from the position shown in phantom lines to the position shown in full lines in FIG. 4. That movement places the windbat assembly 48 onto the shaft of the motor 8 automatically. The end 70 of the chuck 46 may be spread slightly during reception of the motor shaft along the plurality of grooves 90 formed in that end. The natural resiliency of the material of the end 70 will tend to spring lock the chuck 46 to the motor shaft after shaft entrance in the receptacle 91. At least one of the fingers 72 engages a rotating part of the motor 74 so that the windbat assembly 48 is interconnected with a rotating part of the motor 74. After placement, the cylinder 17 of the collet actuator 37 is moved so that the draw bar 38 is forced leftwardly, referenced to FIG. 4, to disengage the collet 40 from the shaft extension 44 of the chuck 46. The cylinder 28 is then returned to the phantom line position shown in FIG. 4, thereby completely disengaging the collet 40 from the chuck 46. During cylinder 28 movement, the switch trip 32 engages the switch 34 to initiate test procedures.

As indicated, the test procedures are conducted on the motor 8 without any mechanical connection to the motor/load combination so that a true representation of motor operation is tested. The sensors 44a and 44b are positioned so that they can read the alternate colored areas on opposite sides of the axis 82 of the strobe disc 50 to determine the direction of motor rotation, while the sensor 14b counts the slots 80 in the strobe discs 50 in order to obtain an accurate representation of motor speed. This arrangement is particularly advantageous when testing relatively small motors, because it imposes no load on the motor during test because of the equipment used to obtain the test results. After all tests are completed, the cylinder 28 is again actuated to move leftwardly as referenced to FIG. 4. As the cylinder 28 approaches the end of its travel, the collect actuator 37 is activated to move the collet 40 leftwardly, referenced to FIG. 4, so that it receives the shaft extension 44 of the chuck 46. Collet actuator 37 is then reversed so that the end 42 of the collet 40 locks on the shaft extension 44. Thereafter, the cylinder 28 is moved toward the right, referenced to FIG. 4 to disengage the windbat 48 from the motor 74.

Figure 7:
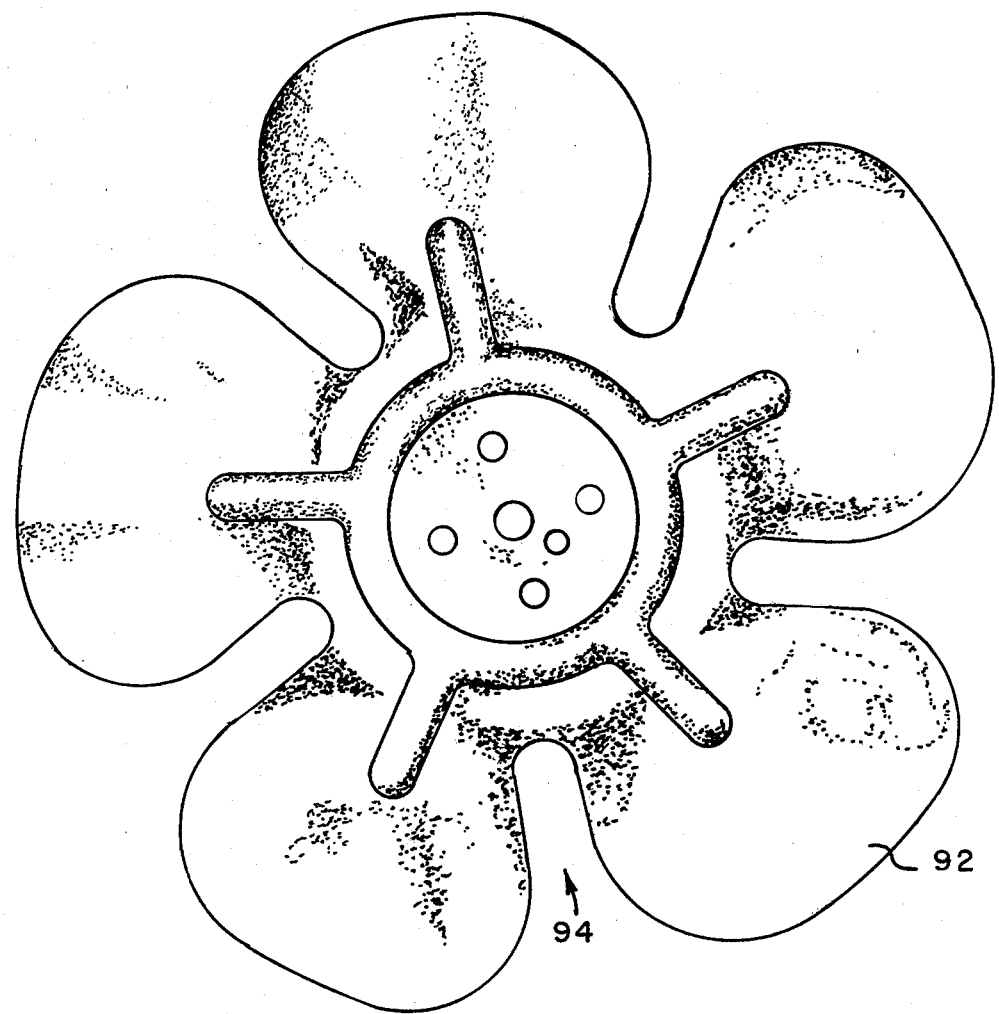
FIG. 7 is a plan view of a motor fan load corresponding to the simulated fan load shown in FIGS. 5 and 6.

Although a simulated fan load for use in the motor test system 1 of this invention was described in conjunction with the preferred embodiment of the invention, those skilled in the art will recognize that a conventional fan load may be employed, if desired. Such a fan load 94 is shown in FIG. 7. As indicated above, we have found that actual fan loads are not usually suitable for production in that blades 92 of the fan load 94 often can be accidentally distorted, and movement of the blades 92 effectively changes the operating characteristics of the fan and motor combination. Nevertheless, the windbat assembly 48 can be replaced by the fan load 44, if desired.

Numerous variations, within the scope of the appended claims, will be apparent to those skilled in the art in light of the foregoing description and accompanying drawings. As indicated, the non-adjustable simulated fan load may be made adjustable, if desired. Although three sensors are employed with the test board of this invention, other sensor combinations may be utilized. The particular designs and physical requirements of the fixture employed in holding the motor 74 in position and the silhouette design of the motor 74 may vary in other embodiments of this invention. For example, the various bracket supporting elements about the surface 11 may be made adjustable so that various motor designs and sizes can be tested. Likewise, the size of the opening 29 can be made adjustable to accommodate those motor size variations. The number of motor test stations and the number of tests both may be changed, if desired. These variations are merely illustrative.

Having thus described the invention, what is claimed and desired to be secured by Letters Patent is:

1. A motor test system, comprising:
    an enclosure defining at least one motor test area;
    means for positioning a motor under test in the motor test area;
    means for automatically attaching and removing a fan load to the motor, said fan load attaching means being disconnected from the motor and fan load during test of the motor;
    a fan load including connect/disconnect means for attaching the fan load to the motor;
    means associated with the fan load for permitting the determination of speed of the fan during motor test, said speed determining means and said fan load forming a single device removably attachable to said motor; and
    means for determining the speed of the fan and direction of rotation of the fan during test.

2. The motor test system of claim 1 wherein said attaching and removing means means comprises actuating means reciprocally movable between a first position remote from the motor under test and a second position permitting attachment or removal of the fan load, and means for removably engaging said fan load.

3. The test board of claim 2 wherein said means for removably engaging said fan load includes a collet for gripping the fan load during attachment and removal, and collet actuator means operatively connected to said collet to effectuate attachment and removal of said fan load.

4. The test system of claim 3 wherein said actuating means comprises an air cylinder.

5. The test system of claim 3 further including means for determining the position of said actuating means.

6. The test system of claim 3 wherein said fan load comprises a simulated fan load.

7. The test system of claim 6 wherein said simulated fan load includes a windbat having a weight and air resistant capability correlated to the weight and air resistant capability of a fan blade with which the motor under test is to be used, said windbat having a chuck attached to it, at least a portion of said chuck being sized for reception on the collet of said fan load engaging means.

8. The test system of claim 7 wherein said simulated fan load further includes a strobe disc having a plurality of openings formed in it, and at least two different colored areas symmetrically positioned on said disc.

9. The test system of claim 8 wherein said simulated fan load further includes first means for interconnecting said chuck to a shaft of the motor under test.

10. The test system of claim 9 wherein said simulated fan load further includes second means for interconnecting said simulated fan load to said motor for ensuring rotation of said simulated fan load with said motor.

11. The test system of claim 10 further including a plurality of sensors, at least one of said sensor plurality being positioned to provide pulse information based on movement of said disc opening plurality past said sensor, and at least another of said sensors being positioned to provide direction of rotation information based on movement of said different colored areas of said disc past said sensors.

12. The test system of claim 1 wherein said fan load is a fan blade.

13. The test system of claim 7 wherein said windbat is adjustable to vary loads obtainable imposed on said motor.

14. A method of testing a motor, comprising the steps of:
    mounting a motor in a test position;
    attaching a single unit to the motor automatically by positively moving the single unit toward the motor including disassociating the attaching device from the motor and unit combination during test, said single unit including a fan load and a speed and direction indicating device;
    energizing the motor;
    obtaining speed and direction of rotation of the motor shaft;
    removing the single unit from said motor; and
    removing the motor from test position.

15. The method of claim 14 including the step of performing high potential voltage tests on the motor while in said test position.

16. In a motor test system for performing operational testing on a motor and load combination, the improvement which comprises means for attaching the load to the motor, said attaching means being disconnected from the motor/load combination during tests, and load means for attachment to the motor, said load means including means for providing direction of rotation and speed information during motor test from a single device removably attached to said motor.

17. In a motor test board, the improvement comprising a simulated test load for use with a motor, said test load being a single assembly including a windbat having a weight correlated to the weight of a fan blade unit with which the motor under test is to be used, a chuck attached to said windbat, said chuck including an end having a receptacle formed in it, said receptacle being sized to receive a shaft of a motor, a strobe disc having a plurality of openings formed in it, said strobe disc having at least two different colored areas symmetrically positioned on said disc, said chuck assembly further including a plurality of fingers extending outwardly from and through a surface of said strobe disc, said fingers being spring loaded in position so that at least one of said fingers engages a rotating portion of a motor during test.

18. The improvement of claim 17 wherein said assembly is attached to a motor during test.

19. In a motor test system for performing operational testing on a motor and load combination, the improvement which comprises means for attaching the load to the motor, said attaching means being disconnected from the motor/load combination during test, and load means for attachment to the motor, said load means including an assembly comprising a single device removably attached to said motor, said device adapted to provide fan blade loading for said motor during test, and a strobe disc having a plurality of openings formed in it, said single device further having at least two colored areas symmetrically positioned on said strobe disc.

20. The improvement of claim 19 wherein said assembly further includes a chuck attached to said device, said chuck including an end having a receptacle formed in it, said receptacle being sized to receive a shaft of a motor.

21. The improvement of claim 20 wherein the chuck of said assembly further includes a plurality of fingers extending outwardly from and through a face of said strobe disc, said fingers being spring loaded in position so that at least one of said fingers engages a rotating portion of a motor during test.

* * * * *